(12) United States Patent
Kwak

(10) Patent No.: US 9,460,795 B2
(45) Date of Patent: Oct. 4, 2016

(54) NONVOLATILE MEMORY DEVICE, A STORAGE DEVICE HAVING THE SAME AND AN OPERATING METHOD OF THE SAME

(71) Applicant: SAMSUNG ELECTRONICS CO., LTD., Suwon-si, Gyeonggi-do (KR)

(72) Inventor: DongHun Kwak, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/792,678

(22) Filed: Jul. 7, 2015

(65) Prior Publication Data

US 2016/0012897 A1    Jan. 14, 2016

(30) Foreign Application Priority Data

Jul. 9, 2014 (KR) ........................ 10-2014-0086181

(51) Int. Cl.
| | | |
|---|---|---|
| *G11C 16/10* | (2006.01) | |
| *G11C 16/04* | (2006.01) | |
| *G11C 16/26* | (2006.01) | |
| *H01L 27/115* | (2006.01) | |

(52) U.S. Cl.
CPC ........... *G11C 16/10* (2013.01); *G11C 16/0483* (2013.01); *G11C 16/26* (2013.01); *H01L 27/11582* (2013.01)

(58) Field of Classification Search
USPC ............ 365/185.17, 185.13, 185.18, 185.23
See application file for complete search history.

(56) References Cited

U.S. PATENT DOCUMENTS

| | | | |
|---|---|---|---|
| 7,436,709 B2 | 10/2008 | Higashitani | |
| 8,310,875 B2 | 11/2012 | Sakurai et al. | |
| 8,374,032 B2 | 2/2013 | Namiki et al. | |
| 8,379,449 B2 | 2/2013 | Maejima | |
| 8,406,063 B2 | 3/2013 | Mokhlesi et al. | |
| 8,422,299 B2 | 4/2013 | Iguchi et al. | |
| 8,526,237 B2 | 9/2013 | Samachisa et al. | |
| 8,570,805 B2 | 10/2013 | Lee et al. | |
| 8,582,361 B2 | 11/2013 | Maejima | |
| 9,196,365 B2 * | 11/2015 | Park .................... | G11C 16/10 |
| 2013/0083599 A1 | 4/2013 | Nam et al. | |
| 2013/0163326 A1 | 6/2013 | Lee et al. | |
| 2013/0242667 A1 * | 9/2013 | Shim ................. | G11C 16/0483 365/185.19 |
| 2014/0098612 A1 | 4/2014 | Hosono et al. | |

FOREIGN PATENT DOCUMENTS

KR    1020130097562    9/2013

* cited by examiner

*Primary Examiner* — Huan Hoang
*Assistant Examiner* — Minh Dinh
(74) *Attorney, Agent, or Firm* — F. Chau & Associates, LLC

(57) ABSTRACT

An operating method of a nonvolatile memory device including a plurality of strings each string including at least two pillars penetrating wordlines disposed at different layers. The operating method includes applying unselected wordline voltages to unselected wordlines, and applying a selected wordline voltage to a selected wordline, and the unselected wordline voltage applied to the same layer as a layer of the selected wordline is different from the unselected wordline voltage applied to a different layer than the layer of the selected wordline.

21 Claims, 16 Drawing Sheets

NONVOLATILE MEMORY DEVICE, A STORAGE DEVICE HAVING THE SAME AND AN OPERATING METHOD OF THE SAME

CROSS-REFERENCE TO RELATED APPLICATION

This U.S. non-provisional patent application claims priority under 35 U.S.C. §119 to Korean Application No. 10-2014-0086181, filed on Jul. 9, 2014, the disclosure of which is incorporated by reference herein in its entirety.

TECHNICAL FIELD

Exemplary embodiments of the present inventive concept relate to a nonvolatile memory device, a storage device having the same, and an operating method of the same.

DISCUSSION OF RELATED ART

Semiconductor memory devices may be classified as volatile semiconductor memory devices or nonvolatile semiconductor memory devices. Nonvolatile semiconductor memory devices can retain stored data even when not powered. Data stored in nonvolatile semiconductor memory devices may be permanent or reprogrammable. Nonvolatile semiconductor memory devices may be used for user data, program and microcode storage in a wide variety of applications in the computer, avionics, telecommunications, and consumer electronics industries.

SUMMARY

An exemplary embodiment of the inventive concept provides an operating method of a nonvolatile memory device including a plurality of strings each string including at least two pillars penetrating wordlines disposed at different layers. The operating method may include applying unselected wordline voltages to unselected wordlines; and applying a selected wordline voltage to a selected wordline; wherein the unselected wordline voltage applied to the same layer as a layer of the selected wordline is different from the unselected wordline voltage applied to a different layer than the layer of the selected wordline.

In an exemplary embodiment of the inventive concept, each of the strings may include a first pillar coupled between a common source line and a back-gate transistor; and a second pillar coupled between a bitline and the back-gate transistor.

In an exemplary embodiment of the inventive concept, when a memory cell of the first or second pillars is driven, the method may include applying a first unselected wordline voltage to an unselected wordline connected to a pillar of the first and second pillars not including the memory cell and disposed at the same layer as the layer of the selected wordline; and applying a second unselected wordline voltage to an unselected wordline connected to the pillar not including the memory cell and disposed above or below the layer of the selected wordline. The first unselected wordline voltage and the second unselected wordline voltage are different from each other.

In an exemplary embodiment of the inventive concept, when a memory cell of the first or second pillars is driven, the method may include applying a first unselected wordline voltage to an unselected wordline connected to a pillar of the first and second pillars not including the memory cell and disposed at the same layer as the layer of the selected wordline; and applying second unselected wordline voltages to at least two unselected wordlines connected to the pillar not including the memory cell and disposed above or below the layer of the selected wordline. The first unselected wordline voltage and each of the second unselected wordline voltages are different from each other.

In an exemplary embodiment of the inventive concept, when a memory cell of the first or second pillars is driven, the method may include applying a first unselected wordline voltage to an unselected wordline connected to a pillar of the first and second pillars not including the memory cell and disposed at the same layer as the layer of the selected wordline; applying a second unselected wordline voltage to an unselected wordline connected to the pillar not including the memory cell and disposed above or below the layer of the selected wordline; and applying a third unselected wordline voltage to an unselected wordline connected to a pillar of the first and second pillars including the memory cell and disposed above or below the layer of the selected wordline. The first unselected wordline voltage, the second unselected wordline voltage, and the third unselected wordline voltage are different from one another.

In an exemplary embodiment of the inventive concept, when a program operation is performed on a memory cell of the first or second pillars, the method may include applying a first pass voltage to an unselected wordline connected to a pillar of the first and second pillars not including the memory cell and disposed at the same layer as the layer of the selected wordline; applying a second pass voltage to an unselected wordline connected to the pillar not including the memory cell and disposed above or below the layer of the selected wordline; applying a third pass voltage to an unselected wordline connected to a pillar of the first and second pillars including the memory cell and disposed above or below the layer of the selected wordline; and applying a pass voltage to the other unselected wordlines of the first and second pillars. The first pass voltage, the second pass voltage, the third pass voltage, and the pass voltage are different from one another.

In an exemplary embodiment of the inventive concept, when a read operation is performed on a memory cell of the first or second pillars, the method may include applying a first read pass voltage to an unselected wordline connected to a pillar of the first and second pillars not including the memory cell and disposed at the same layer as the layer of the selected wordline; applying a second read pass voltage to an unselected wordline connected to the pillar not including the memory cell and disposed above or below the layer of the selected wordline; applying a third read pass voltage to an unselected wordline connected to a pillar of the first and second pillars including the memory cell and disposed above or below the layer of the selected wordline; and applying a read pass voltage to the other unselected wordlines of the first and second pillars. The first read pass voltage, the second read pass voltage, the third read pass voltage, and the read pass voltage are different from one another.

In an exemplary embodiment of the inventive concept, during a program operation including a pass voltage applying period and a program voltage applying period, the different unselected wordline voltages may be applied at the pass voltage applying period.

In an exemplary embodiment of the inventive concept, during a program operation including a pass voltage applying period and a program voltage applying period, the different unselected wordline voltages may be applied at the program voltage applying period.

In an exemplary embodiment of the inventive concept, the different unselected wordline voltages may be applied at the program voltage applying period for a predetermined time, and after the predetermined time, the unselected wordlines are applied with the same pass voltage.

In an exemplary embodiment of the inventive concept, the different unselected wordline voltages may be applied in response to externally received information.

An exemplary embodiment of the inventive concept provides a storage device. The storage device may include at least one nonvolatile memory device including a plurality of strings each string including a first pillar and a second pillar penetrating wordlines disposed at different layers, the first pillar being coupled between a bitline and a back-gate transistor and the second pillar being coupled between a common source line and the back-gate transistor; and a memory controller configured to control the at least one nonvolatile memory device. The at least one nonvolatile memory device may apply different unselected wordline voltages to unselected wordlines depending on a layer on which they are located in relation to a layer of a selected wordline to compensate wordline coupling.

In an exemplary embodiment of the inventive concept, the storage device may further include a coupling compensation unit configured to control the at least one nonvolatile memory device to compensate the wordline coupling.

In an exemplary embodiment of the inventive concept, during a program operation of the at least one nonvolatile memory device, at a pass voltage applying period, a first pass voltage may be applied to an unselected wordline disposed at the same layer as the layer of the selected wordline, a second pass voltage may be applied to an unselected wordline disposed at a layer different from the layer of the selected wordline, and a pass voltage may be applied to the selected wordline. During the program operation of the at least one nonvolatile memory device, at a program voltage applying period, a program voltage may be applied to the selected wordline and the pass voltage may be applied to the unselected wordlines. The first pass voltage, the second pass voltage, and the pass voltage are different from one another.

In an exemplary embodiment of the inventive concept, during a program operation of the at least one nonvolatile memory device, at a pass voltage applying period, a pass voltage is applied to the selected wordline and the unselected wordlines. During the program operation of the at least one nonvolatile memory device, at a program voltage applying period, a first pass voltage may be applied to an unselected wordline disposed at the same layer as the layer of the selected wordline for a predetermined time, a second pass voltage may be applied to an unselected wordline disposed at a layer different from the layer of the selected wordline for the predetermined time, and a program voltage may be applied to the selected wordline. The first pass voltage, the second pass voltage, and the pass voltage are different from one another.

An exemplary embodiment of the inventive concept provides a nonvolatile memory device. The nonvolatile memory device may include a plurality of strings each string including a first pillar coupled between a common source line and a back-gate transistor and a second pillar coupled between a bitline and the back-gate transistor. When a memory cell of the first or second pillars is driven, a first unselected wordline voltage may be applied to a first unselected wordline disposed at the same layer as a layer of the memory cell and connected to the pillar that does not include the memory cell, and a second unselected wordline voltage may be applied to a second unselected wordline disposed at a layer different from the layer of the memory cell and connected to the pillar that does not include the memory cell. The first unselected wordline voltage and the second unselected wordline voltage are different from each other.

In an exemplary embodiment of the inventive concept, a third unselected wordline voltage may be applied to an unselected wordline disposed at a layer different from the layer of the memory cell and connected to the first or the second pillar. The first unselected wordline voltage, the second unselected wordline voltage, and the third unselected wordline voltage are different from one another.

In an exemplary embodiment of the inventive concept, an unselected wordline voltage different from the first unselected wordline voltage, the second unselected wordline voltage, and the third unselected wordline voltage may be applied to the other unselected word lines of the first and second pillars.

In an exemplary embodiment of the inventive concept, the first unselected wordline voltage may be lower than the second unselected wordline voltage during a program operation.

In an exemplary embodiment of the inventive concept, an unselected wordline voltage higher than the first and second unselected wordline voltages may be applied to the other unselected wordlines of the first and second pillars during the program operation.

An exemplary embodiment of the inventive concept provides a method of operating a nonvolatile memory device including a plurality of stacked wordlines, the method comprising: applying a first voltage to a selected wordline; and while the first voltage is applied to the selected wordline, the method further comprises: applying a second voltage to a first unselected wordline disposed at the same layer as a layer of the selected wordline; and applying a third voltage to a second unselected wordline disposed at a different layer than the layer of the selected wordline, wherein the first and second unselected wordlines are adjacent to each other and the first, second and third voltages are different from each other.

The selected wordline is connected to a memory cell disposed along a first pillar and the first unselected wordline is connected to a memory cell disposed along a second pillar.

The second unselected wordline is connected to a memory cell disposed along the second pillar.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Figure 1:
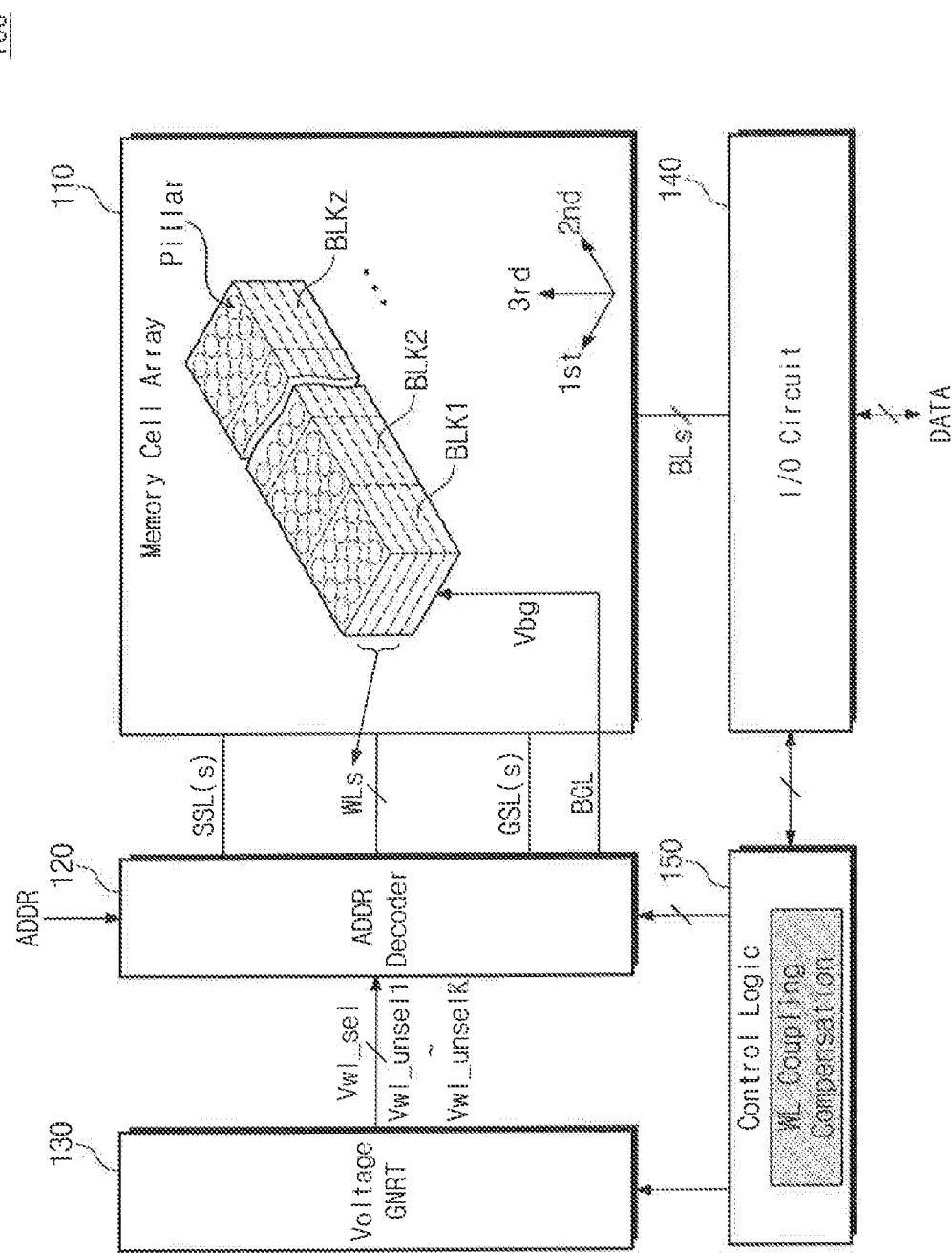
FIG. 1 illustrates a nonvolatile memory device according to an exemplary embodiment of the inventive concept.

Exemplary embodiments of the inventive concept will now be described more fully hereinafter with reference to the accompanying drawings.

The inventive concept, however, may be embodied in various different forms, and should not be construed as being limited only to the illustrated embodiments. Unless otherwise noted, like reference numerals denote like elements throughout the attached drawings and written description, and thus descriptions may not be repeated. In the drawings, the sizes and relative sizes of layers and regions may be exaggerated for clarity.

As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected, coupled, or adjacent to the other element or layer, or intervening elements or layers may be present.

FIG. 1 illustrates a nonvolatile memory device 100 according to an exemplary embodiment of the inventive concept. As illustrated in FIG. 1, the nonvolatile memory device 100 includes a memory cell array 110, an address decoder (ADDR Decoder) 120, a voltage generation circuit (Voltage GNRT) 130, an input/output circuit (I/O Circuit) 140, and a control logic 150.

The memory cell array 110 includes a plurality of memory blocks BLK1 to BLKz (z being an integer equal to or greater than 2). Each of the memory blocks BLK1 to BLKz is connected to the address decoder 120 through a back-gate line BGL, wordlines WLs, at least one string select line SSL, and at least one ground select line GSL and is connected to the I/O circuit 130 through bitlines BLs. In an exemplary embodiment of the inventive concept, the wordlines WLs may be implemented in the form of stacked plates.

Each of the memory blocks BLK1 to BLKz includes a plurality of strings. Each of the strings includes at least two pillars formed through the wordlines WLs in the form plates. The at least two pillars may be connected to each other by a pillar connection portion included in a back-gate formed on a substrate. Each of the pillars may be disposed on the substrate in a first direction and a second direction (e.g., different from the first direction) and may be disposed on the substrate in a third direction (e.g., perpendicular to a plane formed in the first direction and the second direction). Each of the pillars may include a semiconductor layer in the form of a cylinder extending in a direction perpendicular to the substrate, an insulating layer surrounding the semiconductor layer, and a charge storage layer surrounding the insulating layer.

For convenience of description, it is assumed that each of the strings includes two pillars. Each of the strings includes at least one string select transistor coupled in series between a bitline and a common source line, first memory cells (or first cell transistors), a back-gate transistor, second memory cells (or second cell transistors), and at least one ground select transistor. Each of the first and second memory cells may be implemented with a stacked-gate type transistor including an insulating layer, a charge storage layer, a control gate, and the like. In addition, each of the first and second memory cells may store at least one bit. Further, at least one dummy cell may be included between the at least one string select transistor and the first memory cells. In an exemplary embodiment of the inventive concept, at least one dummy cell may be included between the second memory cells and the at least one ground select transistor. The back-gate transistor includes a pipe-shaped pillar connection portion to connect a first pillar corresponding to the first memory cells and a second pillar corresponding to the second memory cells to each other. The pillar connection portion may be buried in the back-gate. The pillar connection portion and the back-gate constitute the back-gate transistor. A conductive state and a non-conductive state of the pillar connection portion may be decided based on a back-gate voltage Vbg applied to the back-gate.

The address decoder 120 may select one of the memory blocks BLK1 to BLKz in response to an address ADDR. The address decoder 120 is connected to the memory cell array 110 through the back-gate line BGL, the wordlines WLs, the at least one string select line SSL, and the at least one ground select line GSL.

In an exemplary embodiment of the inventive concept, the address decoder 120 may include a back-gate line driver to operate the back-gate line BGL, at least one wordline driver to operate the wordlines WLs, a string select line driver to operate the at least one string select line SSL, and a ground select line driver to operate the at least one ground select line GSL.

The address decoder 120 may decode a column address among an input address. The decoded column address may be transmitted to the I/O circuit 140. In an exemplary embodiment of the inventive concept, the address decoder 120 may include a row decoder, a column decoder, an address buffer, and the like.

The voltage generation circuit 130 may generate voltages used for operations (e.g., a program voltage, a pass voltage, a read voltage, a read pass voltage, a verify voltage, an erase voltage, a common source line voltage, a well voltage, the back-gate voltage Vbg, etc.) of the nonvolatile memory device 100.

In particular, the voltage generation circuit 130 may generate a selected wordline voltage Vwl_sel and unselected wordline voltages Vwl_unsel1 to Vwl_unselK (K being an integer equal to or greater than 2) used for program/read operations. The selected wordline voltage Vwl_sel is a voltage applied to a selected one of the wordlines WLs, and the unselected wordline voltages Vwl_unsel1 to Vwl_unselK are voltages applied to unselected wordlines. The unselected wordline voltages Vwl_unsel1 to Vwl_unselK may be varied/adjusted/modified/changed/controlled according to a position of the selected wordline.

The I/O circuit 140 is connected to the memory cell array 110 through the bitlines BLs. The I/O circuit 140 may be configured to receive a decoded column address from the address decoder 120. The I/O circuit 140 may select at least one of the bitlines BLs using the decoded column address.

The I/O circuit 140 includes a plurality of page buffers to store data DATA to be programmed during a program operation or to store read data during a read operation. Each of the page buffers may include a plurality of latches. During a program operation, the data stored in the page buffers may be programmed into a page corresponding to a selected memory block of the memory blocks BLK1 to BLKz through the bitlines BLs. During a read operation, the data read from the page corresponding to the selected memory block may be stored in the page buffers through the bitlines BLs. The I/O circuit 140 may read data from a first region of the memory cell array 110 and store the read data in a second region of the memory cell array 110. For example, the I/O circuit 140 may be implemented to perform a copyback operation.

The control logic 150 may control the overall operation (e.g., program/read/erase operations, etc.) of the nonvolatile memory device 100. The control logic 150 may operate in response to control signal or a command that is externally input. In particular, the control logic 150 may control the voltage generation circuit 130 to perform wordline (WL) coupling compensation. For example, in WL coupling compensation, unselected wordline voltages Vwl_unsel1 to Vwl_unselK are varied/adjusted/changed/controlled in consideration of wordline coupling at a memory cell connected to a selected wordline.

The nonvolatile memory device 100 may apply different selected wordline voltages Vwl_unsel1 to Vwl_unselK to unselected wordlines based on their position with respect to a layer of a selected wordline to compensate wordline coupling. Thus, the nonvolatile memory device 100 may enhance characteristics of a memory cell.

Figure 2:
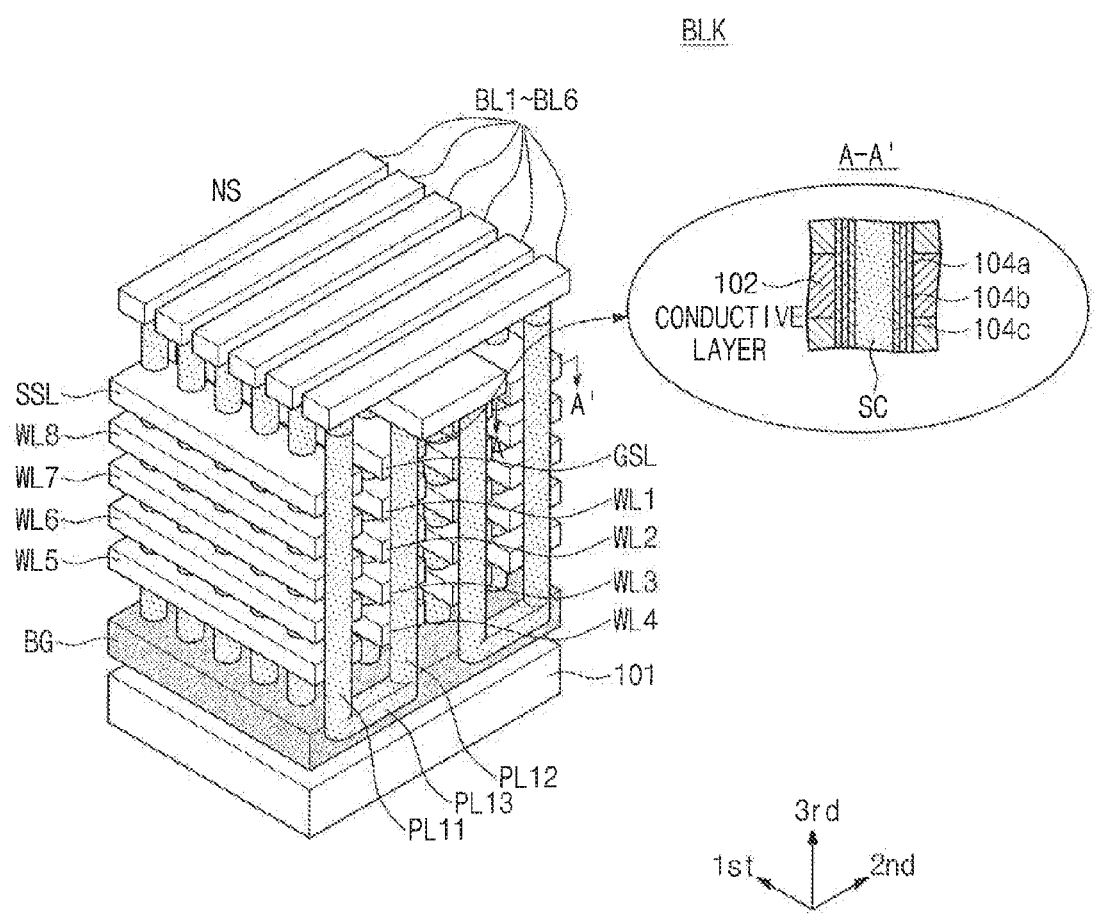
FIG. 2 illustrates a memory block in FIG. 1 according to an exemplary embodiment of the inventive concept.

FIG. 2 is a perspective view illustrating a memory block shown in FIG. 1, according to an exemplary embodiment of the inventive concept. For convenience of description, it is assumed that the number of wordline layers is four. Referring to FIG. 2, a memory block is implemented using a pipe-shaped bit cost scalable (PBiCS) structure where lower ends of adjacent memory cells connected in series are connected by a pipe. A memory block BLK includes strings NS of m×n (m and n being positive integers). In FIG. 2, m=6 and n=2. Each of the strings NS includes serially connected memory cells MC1 to MC8. First upper ends of the memory cells MC1 to MC8 are connected to a string select line SSL, and second upper ends of the memory cells MC1 to MC8 are connected to a ground select line GSL. Lower ends of the memory cells MC1 to MC8 are pipe-connected.

Memory cells constituting a string NS are stacked on a plurality of semiconductor layers to be formed. Each string NS includes a first pillar PL11, a second pillar PL12, and a pillar connection portion PL13 connecting the first and second pillars PL11 and PL12 to each other. The first pillar PL11 is connected to a bitline (e.g., BL6) and the pillar connection portion PL13 and is formed through the string select line SSL and wordlines WL5 to WL8. The second pillar PL12 is connected to the pillar connection portion PL13 and is formed through wordlines WL1 to WL4. As shown in FIG. 2, the string NS is implemented with a U-shaped pillar.

In an exemplary embodiment of the inventive concept, a back-gate BG may be formed on a substrate 101 and the pillar connection portion PL13 may be implemented in the back-gate BG. In an exemplary embodiment of the inventive concept, the back-gate BG may commonly exist in the blocks BLK1 to BLKz. The back-gate BG may be isolated from a back-gate of another block.

A sectional structure of a memory cell corresponding to a section A-A' in FIG. 2 may include a gate oxide layer 104c, a charge storage layer 104b, and an insulating layer (or blocking layer) 104a having a higher dielectric constant than the gate oxide layer 104c around a semiconductor layer SC sequentially along an in-plane of a first direction and a second direction from a surface of the semiconductor layer SC. A conductive layer 102 is formed to surround a surface of the blocking layer 104a. The conductive layer 102 may be a wordline WL and function as a control gate of a memory cell MC.

Figure 3:
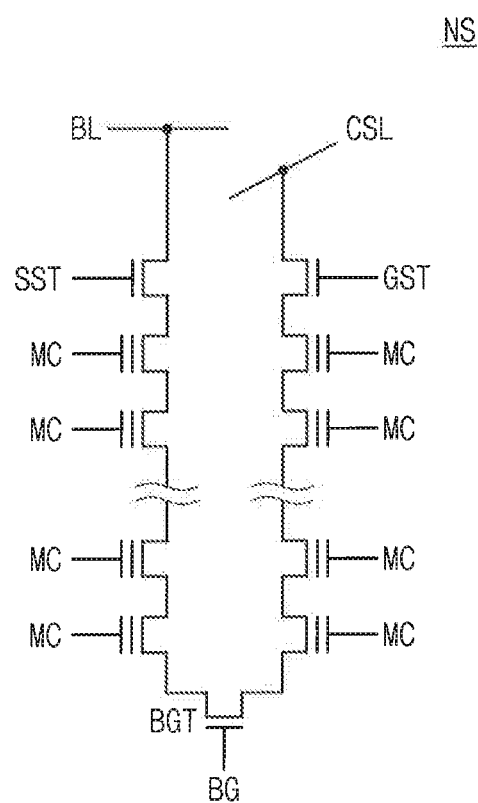
FIG. 3 illustrates a circuit diagram of a string in FIG. 2 according to an exemplary embodiment of the inventive concept.

FIG. 3 is a circuit diagram of a single string shown in FIG. 2, according to an exemplary embodiment of the inventive concept. Referring to FIG. 3, a string NS includes a string select transistor SST, a plurality of first memory cells MCs, a back-gate transistor BGT, a plurality of second memory cells MCs, and a ground select transistor GST that are connected in series between a bitline BL and a common source line CSL. The back-gate transistor BGT includes a gate connected to a back-gate BG.

Figure 4:
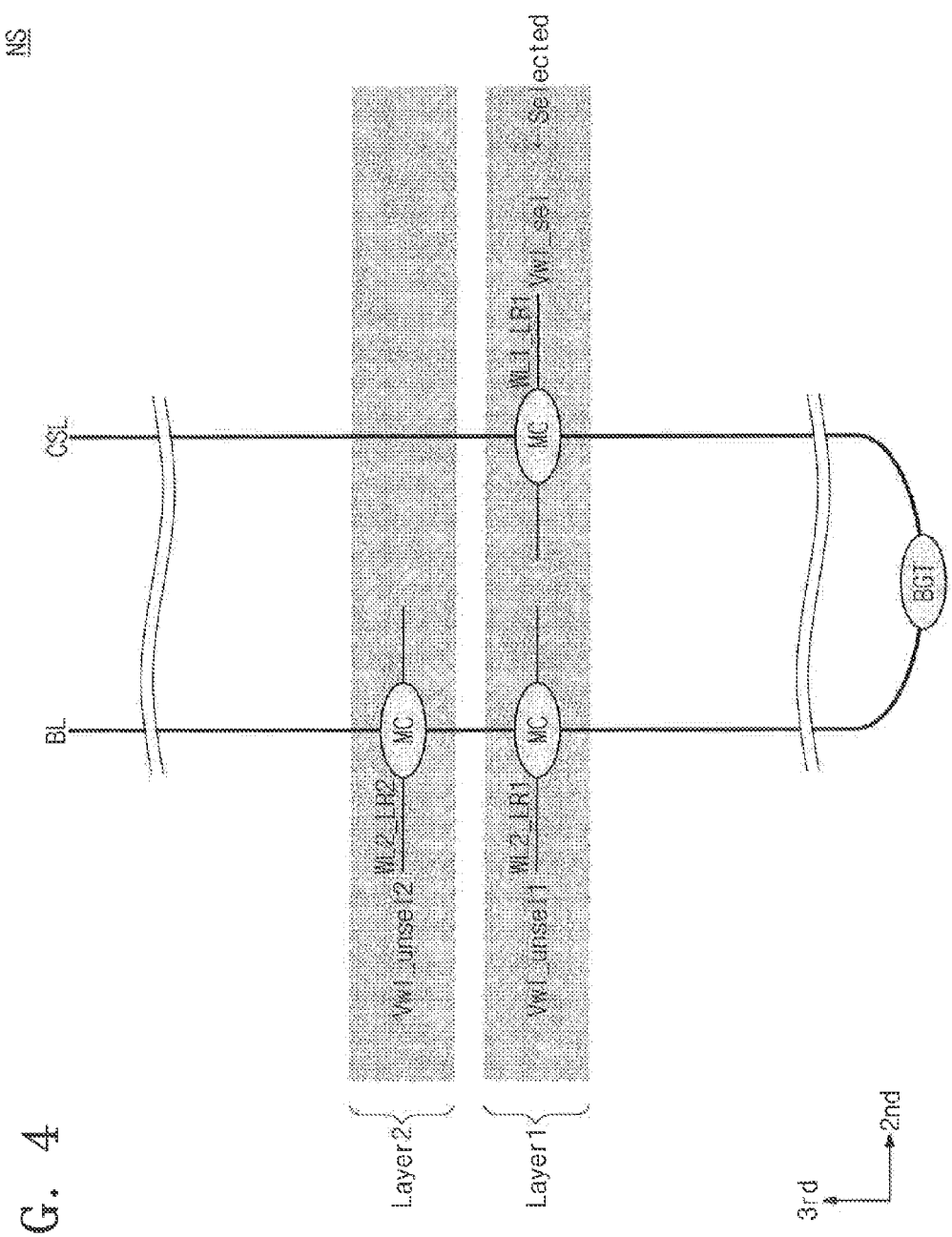
FIG. 4 illustrates an operating method of a nonvolatile memory device according to an exemplary embodiment of the inventive concept.

FIG. 4 illustrates an operating method of a nonvolatile memory device according to an exemplary embodiment of the inventive concept. The nonvolatile memory device of FIG. 4 may be the nonvolatile memory device 100 of FIG. 1. For convenience of description, it is assumed that a memory cell connected to a first wordline WL1_LR1 of a first layer (Layer 1) operates.

The operating method is now described. When a selected wordline voltage Vwl_sel is applied to the first wordline WL1_LR1 of the first layer (Layer 1), a first unselected wordline voltage Vwl_unsel1 is applied to a second wordline WL2_LR1 of the first layer (Layer 1) and a second unselected wordline voltage Vwl_unsel2 is applied to a second wordline WL2_LR2 of a second layer (Layer 2). The second layer (Layer 2) may be disposed over the first layer (Layer 1). The first unselected wordline voltage Vwl_unsel1 may be different from the second unselected wordline voltage Vwl_unsel2.

In an exemplary embodiment of the inventive concept, the first wordline WL1_LR1 of the first layer (Layer 1) may be connected to a memory cell MC coupled between a common source line CSL and a back-gate transistor BGT, as shown in FIG. 4. In an exemplary embodiment of the inventive concept, the first wordline WL1_LR1 of the first layer (Layer 1) may be connected to a memory cell MC coupled between a bitline BL and the back-gate transistor BGT.

In an exemplary embodiment of the inventive concept, the second wordline WL2_LR1 of the first layer (Layer 1) or the second wordline WL2_LR2 of the second layer (Layer 2) may be connected to a memory cell MC coupled between the bitline BL and the back-gate transistor BGT, as shown in FIG. 4. In an exemplary embodiment of the inventive concept, the second wordline WL2_LR1 of the first layer (Layer 1) or the second wordline WL2_LR2 of the second layer (Layer 2) may be connected to a memory cell MC coupled between the common source line CSL and the back-gate transistor BGT.

During operation of the nonvolatile memory device 100, the nonvolatile memory device 100 may apply the unselected wordline voltage Vwl_unsel1 with a first level to the unselected wordline WL2_LR1 and the unselected wordline voltage Vwl_unsel2 with a second level to the unselected wordline WL2_LR2. The first level and second level may be different from each other. This way, the unselected wordline WL2_LR1 which is located on the same layer as the selected wordline WL1_LR1 and the unselected wordline WL2_LR2 which is located on a different layer than the selected wordline WL1_LR1 receive different voltages.

In FIG. 4, a layer (e.g., Layer 2) for compensating wordline coupling may be disposed over a layer of the selected wordline WL1_LR1. However, the inventive concept is not limited thereto. The layer for compensating wordline coupling may be disposed below a layer of the selected wordline WL1_LR.

Figure 5:
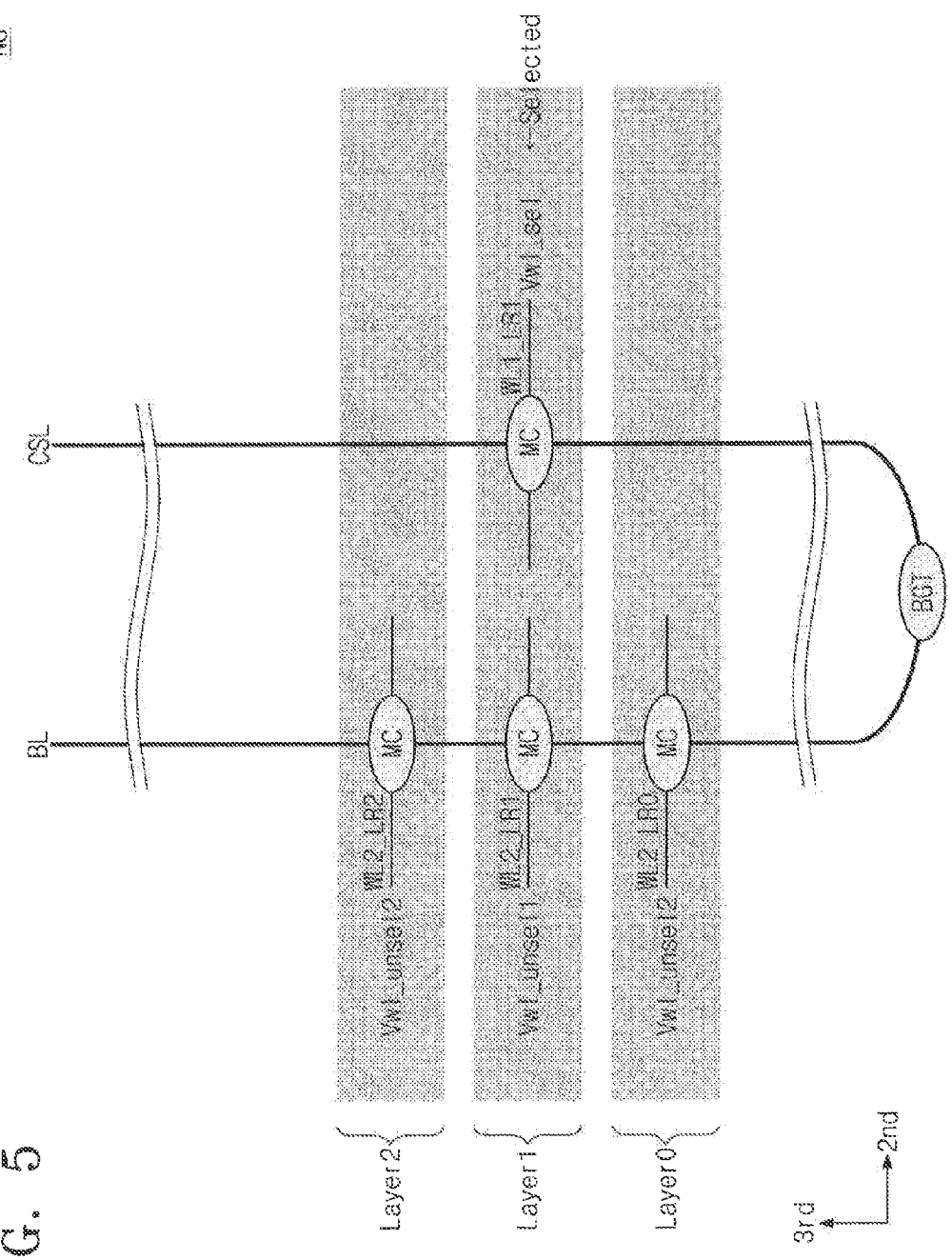
FIG. 5 illustrates an operating method of a nonvolatile memory device according an exemplary embodiment of the inventive concept.

FIG. 5 illustrates an operating method of a nonvolatile memory device according an exemplary embodiment of the inventive concept. The nonvolatile memory device of FIG. 5 may be the nonvolatile memory device 100 of FIG. 1. Unlike the operating method illustrated in FIG. 4, a second unselected wordline voltage Vwl_unsel2 is applied to a wordline WL2_LR0 of a layer (Layer 0) disposed below a first layer (Layer 1).

In FIG. 5, a layer for compensating wordline coupling is a single overlying layer and a single underlying layer. However, the inventive concept is not limited thereto. A layer for compensating wordline coupling may be a plurality of layers above or below a layer of a selected wordline WL1_LR1.

Figure 6:
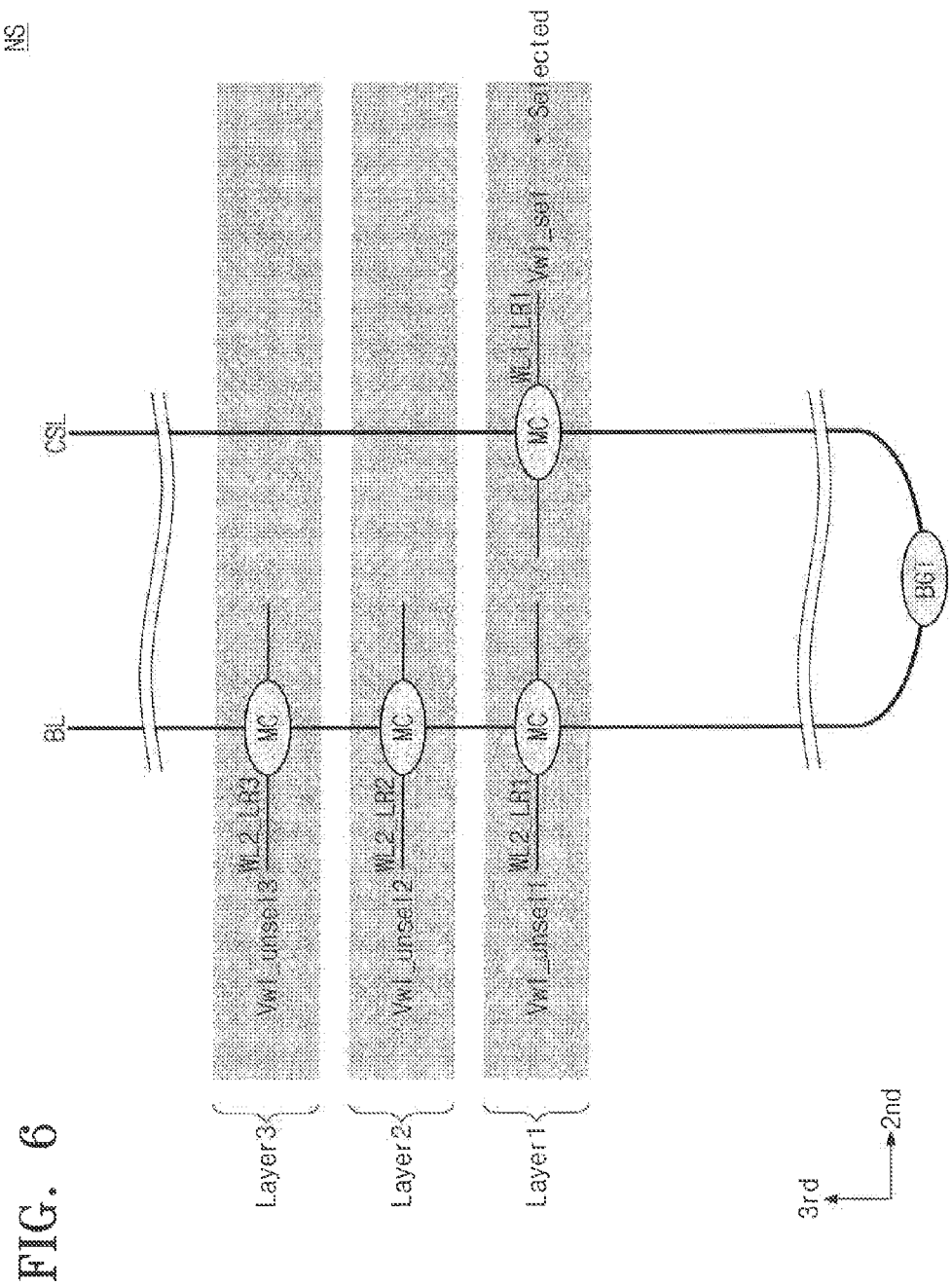
FIG. 6 illustrates an operating method of a nonvolatile memory device according an exemplary embodiment of the inventive concept.

FIG. 6 illustrates an operating method of a nonvolatile memory device according an exemplary embodiment of the inventive concept. The nonvolatile memory device of FIG. 6 may be the nonvolatile memory device 100 of FIG. 1. Unlike the operating method illustrated in FIG. 5, a third unselected wordline voltage Vwl_unsel3 is applied to a wordline WL2_LR3 of a third layer (Layer 3) disposed over a first layer (Layer 1).

In FIG. 6, different unselected wordline voltages Vwl_unsel1, Vwl_unsel2, and Vwl_unsel3 are applied to different layers (Layer 1 to Layer 3). In other words, the different unselected wordline voltages Vwl_unsel1, Vwl_unsel2, and Vwl_unsel3 are applied to different unselected wordlines. However, the inventive concept is not limited thereto. Unselected wordlines may be divided into a plurality of groups, and unselected wordline voltages corresponding to the groups may be applied.

As described in FIGS. 4 to 6, different unselected wordline voltages are applied to unselected wordlines connected to a pillar BL-BCT facing a selected wordline WL1_LR1. However, the inventive concept is not limited thereto. Different unselected wordline voltages may be applied to unselected wordlines connected to a pillar CSL-BGT corresponding to the selected wordline WL1_LR1.

Figure 7:
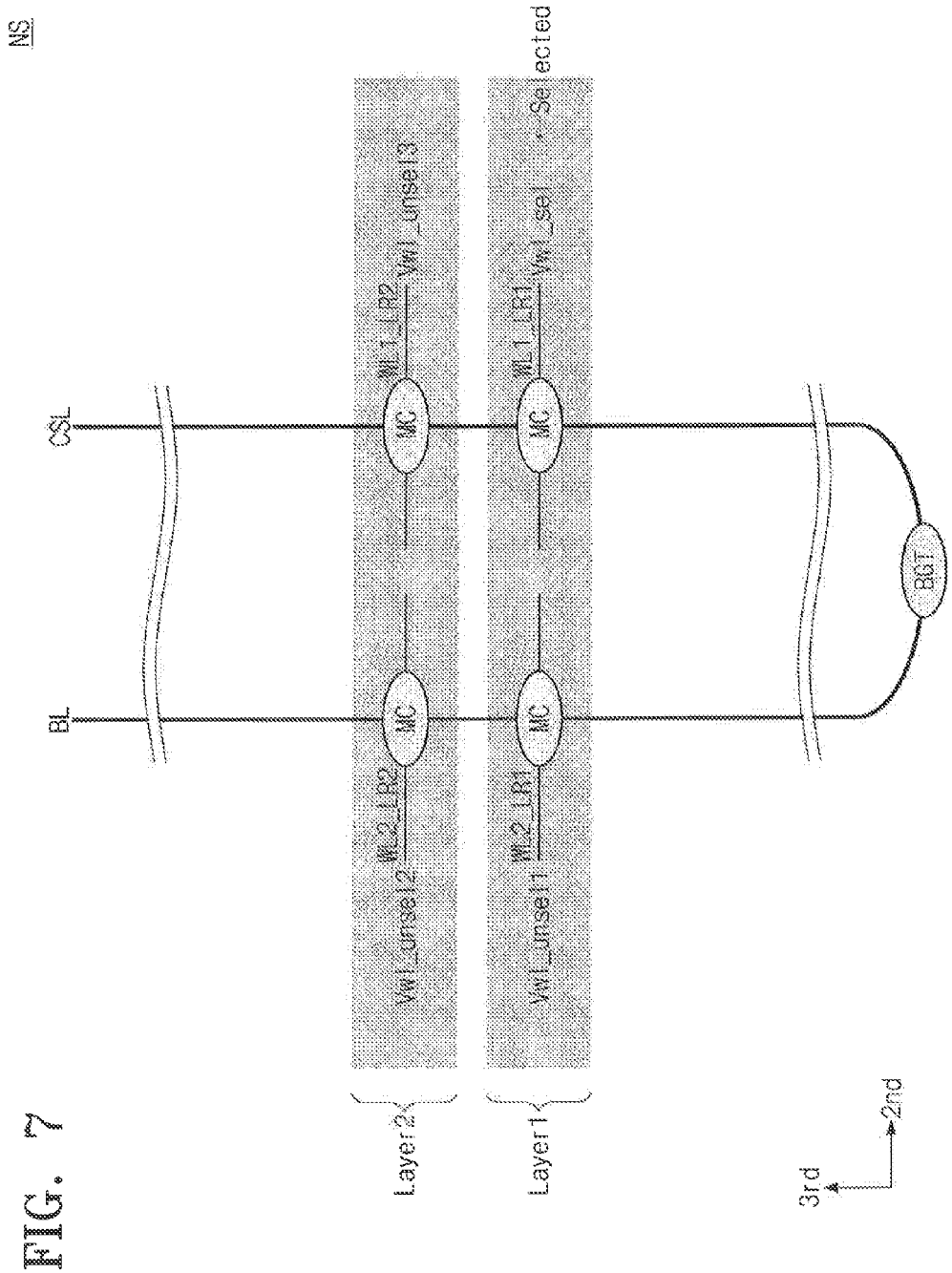
FIG. 7 illustrates an operating method of a nonvolatile memory device according an exemplary embodiment of the inventive concept.

FIG. 7 illustrates an operating method of a nonvolatile memory device according an exemplary embodiment of the inventive concept. The nonvolatile memory device of FIG. 7 may be the nonvolatile memory device 100 of FIG. 1. Unlike the operating method illustrated in FIG. 4, a third unselected wordline voltage Vwl_unsel3 is applied to a wordline WL1_LR2 of a second layer (Layer 2) disposed over a selected wordline WL1_LR1. The wordline WL1_LR2 is an unselected wordline connected to the pillar CSL-BGT corresponding to the selected wordline WL1_LR1.

Figure 8:
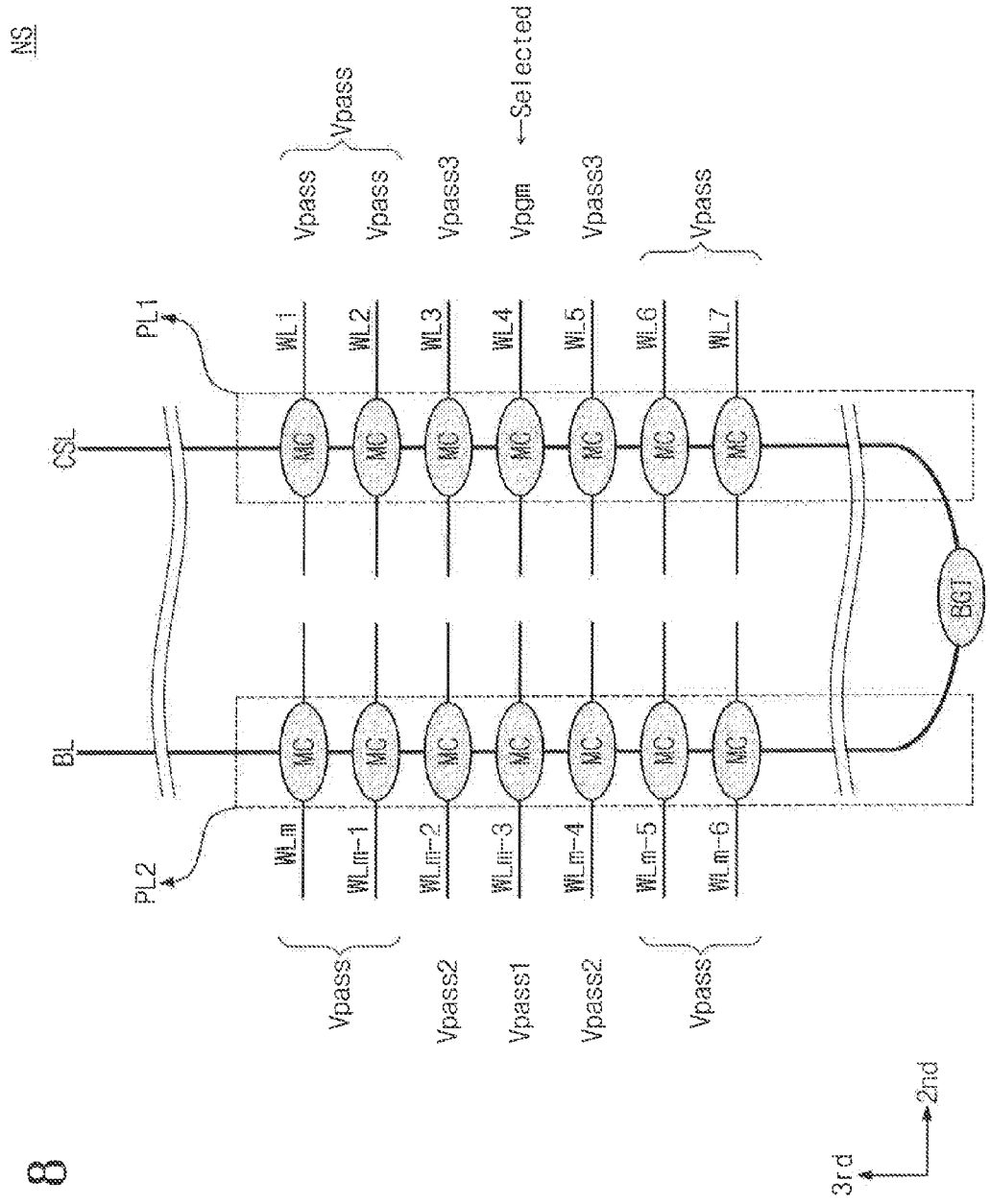
FIG. 8 shows a bias condition of a program operation of a nonvolatile memory device according to an exemplary embodiment of the inventive concept.

FIG. 8 shows a bias condition of a program operation of a nonvolatile memory device according to an exemplary embodiment of the inventive concept. The nonvolatile memory device of FIG. 8 may be the nonvolatile memory device 100 of FIG. 1. Referring to FIG. 8, a string NS includes a first pillar PL1 connected to stacked wordlines WL1, WL2, WL3, . . . WL7 between a common source line CSL and a back-gate transistor BGT and a second pillar PL2 coupled between stacked wordlines WLm, WLm-1, WLm-2, . . . WLm-6 between the back-gate transistor BGT and a bitline BL. For convenience of description, it is assumed that a program operation is performed on a memory cell MC connected to a fourth wordline WL4.

Referring to FIG. 8, a program bias condition is as follows: a program voltage Vpgm is applied to the selected wordline WL4, a first pass voltage Vpass1 is applied to a most adjacent wordline WLm-3 of the second pillar PL2 (BL-BGT), a second pass voltage Vpass2 is applied to unselected wordlines WLm-2 and WLm-4 adjacent to the most adjacent unselected wordline WLm-3, a third pass voltage Vpass3 is applied to most adjacent unselected wordlines WL3 and WL5 of a first pillar PL1 (CSL-BGT), and a pass voltage Vpass is applied to the other unselected wordlines of the first and second pillars PL1 and PL2. The most adjacent unselected wordline WLm-3 of the second pillar PL2 is disposed at the same layer as the selected wordline WL4, and the unselected wordlines WLm-2 and WLm-4 adjacent to the most adjacent unselected wordline WLm-3 and the most adjacent unselected wordlines WL3 and WL5 are disposed at different layers than the selected wordline WL4.

The bias condition of the program operation shown in FIG. 8 is merely exemplary. The nonvolatile memory device 100 according to an exemplary embodiment of the inventive concept may apply different pass voltages to unselected wordlines under various bias conditions.

Figure 9:
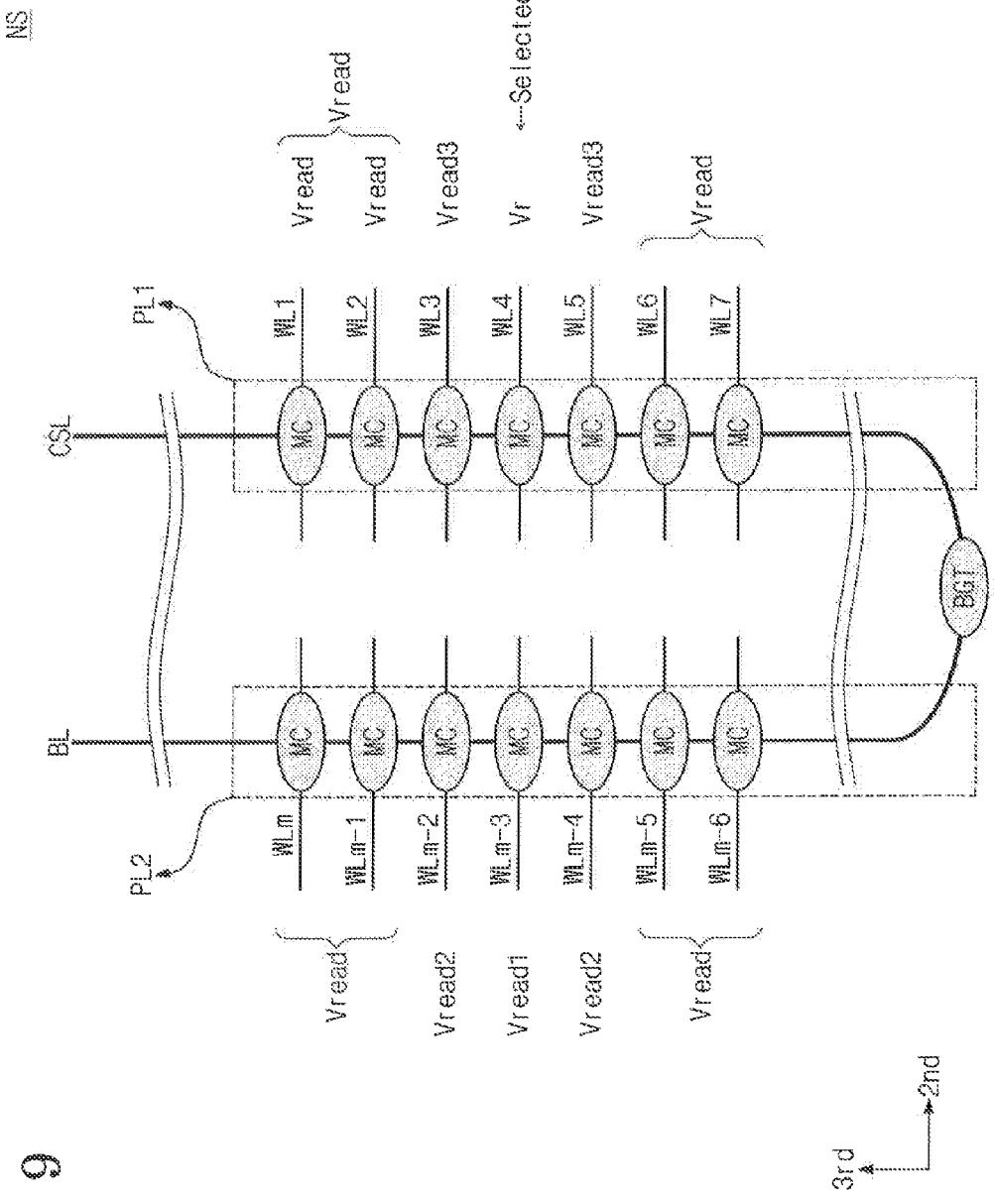
FIG. 9 illustrates a bias condition of a read operation of a nonvolatile memory device according to an exemplary embodiment of the inventive concept.

FIG. 9 illustrates a bias condition of a read operation of a nonvolatile memory device according to an exemplary embodiment of the inventive concept. The nonvolatile memory device of FIG. 9 may be the nonvolatile memory device 100 of FIG. 1. For convenience of description, it is assumed that a read operation is performed on a memory cell MC connected to a fourth wordline WL4.

Referring to FIG. 9, a read bias condition is as follows: a read voltage Vr is applied to the selected wordline WL4, a first read pass voltage Vread1 is applied to a most adjacent unselected wordline WLm-3 of a second pillar PL2, a second read pass voltage Vread2 is applied to unselected wordlines WLm-2 and WLm-4 adjacent to the most adjacent unselected wordline WLm-3, a third read pass voltage Vread3 is applied to most adjacent unselected wordlines WL3 and WL5 of a first pillar PL1, and a read pass voltage Vread is applied to the other unselected wordlines of the first and second pillars PL1 and PL2.

The bias condition of the read operation condition shown in FIG. 9 is merely exemplary. The nonvolatile memory device 100 according to an exemplary embodiment of the inventive concept may apply different read pass voltages to unselected wordlines by various methods and under various bias conditions.

Figure 10:
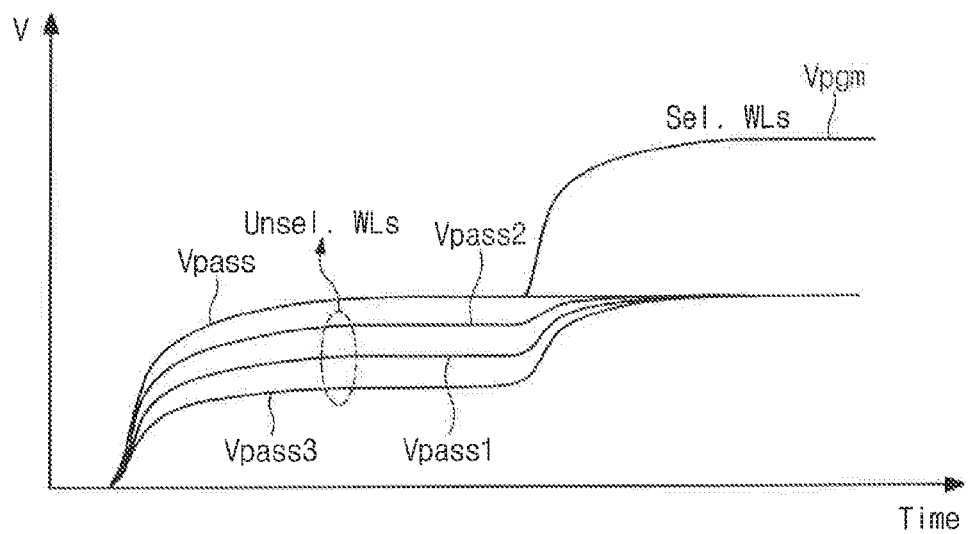
FIG. 10 illustrates timing of a program operation of a nonvolatile memory device according to an exemplary embodiment of the inventive concept.

FIG. 10 illustrates a program operation of a nonvolatile memory device according to an exemplary embodiment of the inventive concept. The nonvolatile memory device of FIG. 10 may be the nonvolatile memory device 100 of FIG. 1. Referring to FIG. 10, a program operation is divided into two sections. The two sections include a pass voltage applying period in which pass voltages Vpass, Vpass1, Vpass2, and Vpass3 are applied to all wordlines Sel. and Unsel. WLs and a program voltage applying period in which a program voltage Vpgm is applied to a selected wordline Sel. WL. In the pass voltage applying period, the different pass voltages Vpass1, Vpass2, Vpass3, and Vpass are applied according to positions A, B, and C of the wordlines Sel. and Unsel. WLs or capacitance of wordline coupling. In the program voltage applying period, the program voltage Vpgm is applied to the selected wordline Sel. WL and the pass voltage Vpass is applied to unselected wordlines Unsel. WL.

In the pass voltage applying period, different pass voltages are applied according to wordline positions to compensate wordline coupling. However, the inventive concept is not limited thereto. In the program voltage applying period, different pass voltages may be applied according to wordline positions to compensate wordline coupling.

Figure 11:
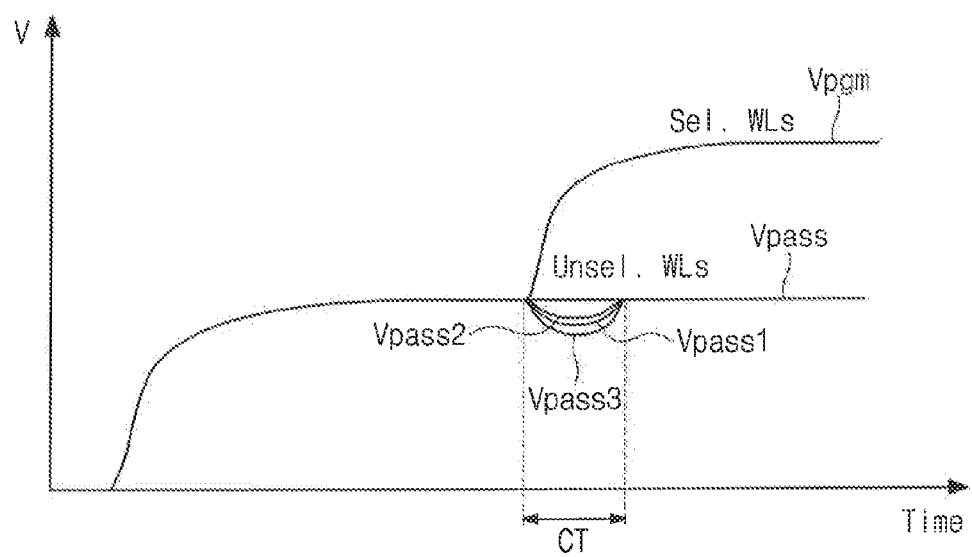
FIG. 11 illustrates timing of a program operation of a nonvolatile memory device according to an exemplary embodiment of the inventive concept.

FIG. 11 illustrates timing of a program operation of a nonvolatile memory device according to an exemplary embodiment of the inventive concept. The nonvolatile memory device of FIG. 11 may be the nonvolatile memory device 100 of FIG. 1. Referring to FIG. 11, in a pass voltage applying period, the same pass voltage Vpass is applied to all wordlines Sel. and Unsel. WLs. In a program voltage applying period, a program voltage is applied to the selected wordline Sel. WL and different pass voltages Vpass, Vpass1, Vpass2, and Vpass3 are applied to the unselected wordlines Unsel. WL for a predetermined compensation time CT according to wordline positions or capacitance of wordline coupling. Still in the program voltage applying period, the same pass voltage Vpass is applied the unselected wordlines Unsel. WL after the compensation time CT.

Figure 12:
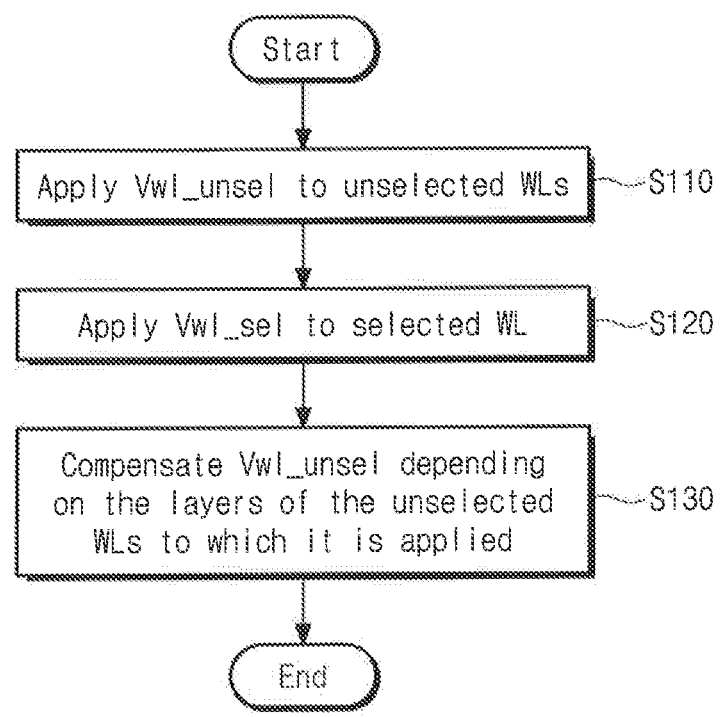
FIG. 12 is a flowchart of an operating method of a nonvolatile memory device according to an exemplary embodiment of the inventive concept.

FIG. 12 is a flowchart of an operating method of a nonvolatile memory device according to an exemplary embodiment of the inventive concept. Referring to FIGS. 1 to 12, the operating method of the nonvolatile memory device 100 will now be described below.

At least one unselected wordline voltage Vwl_unsel is applied to unselected wordlines (S110). A selected wordline voltage Vwl_sel is applied to a selected wordline (S120). The unselected wordline voltage Vwl_unsel is compensated depending on the layer of the unselected wordline to which it is applied (S130). In other words, the unselected wordline voltage applied to a layer two layers from the layer of a selected wordline may be compensated differently from the unselected wordline voltage applied to a layer one layer from the layer of the selected wordline. The compensation of the unselected wordline Vwl_unsel may be carried out when the at least one unselected wordline voltage Vwl_unsel is applied to unselected wordlines or the selected wordline voltage Vwl_sel is applied to a selected wordline.

According to the above-described operating method of the nonvolatile memory device 100, an unselected wordline voltage may be compensated differently according to a position of a layer to which it is applied.

Figure 13:
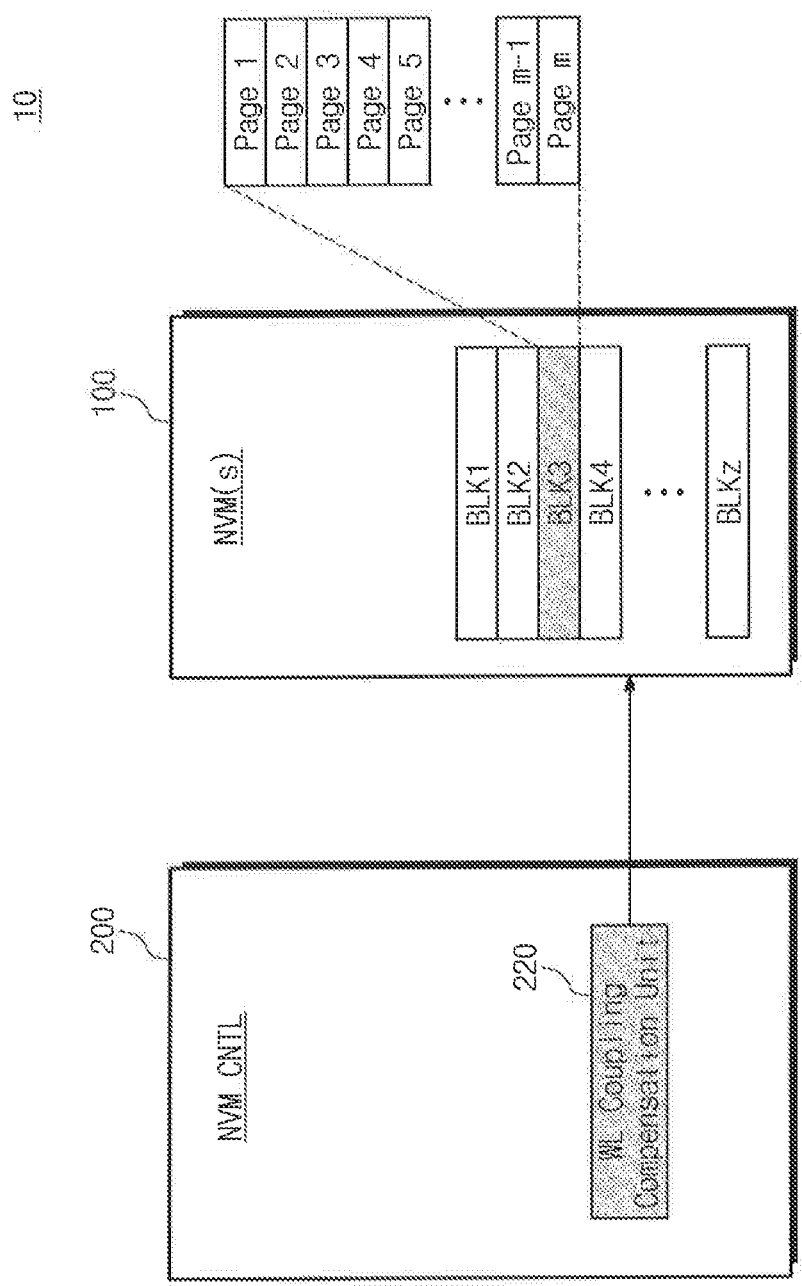
FIG. 13 illustrates a storage device according to an exemplary embodiment of the inventive concept.

FIG. 13 illustrates a storage device 10 according to an exemplary embodiment of the inventive concept. As illustrated, the storage device 10 includes at least one nonvolatile memory device 100 and a memory controller 200 to control the at least one nonvolatile memory device 100.

The at least one nonvolatile memory device 100 may be implemented using the three-dimensional memory device 100 shown in FIG. 1 or may be implemented to perform a wordline coupling compensation operation, as described in FIGS. 1 to 12.

The memory controller 200 may include a wordline coupling compensation unit 220 to manage wordline coupling compensation. For example, the wordline coupling compensation unit 220 may be enabled when there is a need for enhancing characteristics of a memory cell. The wordline coupling compensation unit 220 may allow the nonvolatile memory device 100 to apply different unselected wordline voltages according to wordline positions or wordline coupling capacitance during a program, a read or an erase operation.

The storage device 10 may perform a wordline coupling compensation operation according to a predetermined scheme.

As shown in FIG. 12, the nonvolatile memory device 100 may include blocks BLK1 to BLKz. Each block may include a plurality of pages Page 1 to Page m.

A nonvolatile memory device according to an exemplary embodiment of the inventive concept may control voltages applied to adjacent unselected wordlines to be different according to their positions relative to a selected wordline when controlling a selected wordline voltage to be different from an adjacent wordline voltage. This way, characteristics of a memory cell may be improved.

In general, capacity between wordlines of a vertical structure is higher than that of a planar structure. Thus, a coupling effect may be induced at adjacent wordlines when a voltage of a selected wordline voltage is controlled to be different from a voltage of an adjacent wordline. In consideration of the coupling effect, a target voltage of the adjacent wordline may be set to be lower than that of a non-adjacent wordline.

In a vertical structure, the coupling effect may be different according to positions of adjacent wordlines. A vertically adjacent unselected wordline voltage set offset may be set to be smaller than a horizontally or diagonally adjacent unselected wordline voltage set offset. The three types (e.g., vertically adjacent/horizontally adjacent/diagonally adjacent) of adjacent unselected wordline voltage set offsets may be set to be smaller than the other unselected wordline voltage set offsets.

Figure 14:
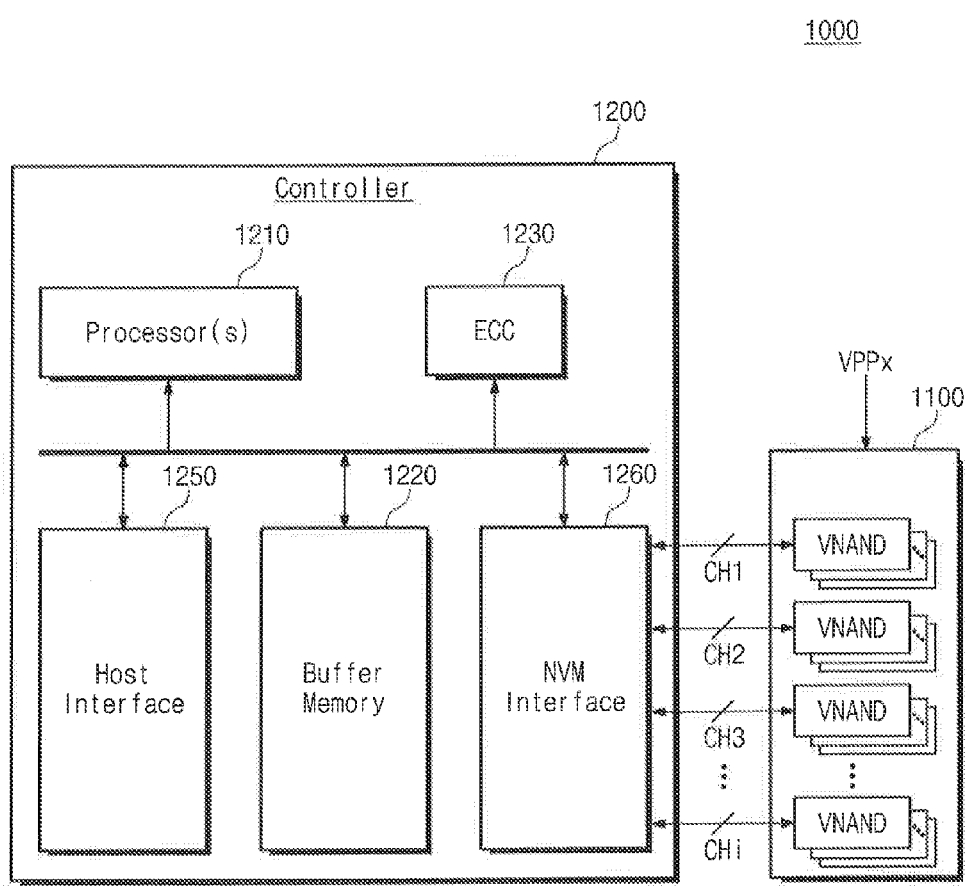
FIG. 14 illustrates a solid-state drive (SSD) according to an exemplary embodiment of the inventive concept.

The inventive concept may be applied to a solid state drive (SSD). FIG. 14 is a block diagram of an SSD 1000 according to an exemplary embodiment of the inventive concept. As illustrated, the SSD 1000 includes a plurality of nonvolatile memory devices 1100 (e.g., plural VNAND stacks) and an SSD controller 1200.

The nonvolatile memory devices 1100 may be implemented to receive an external high voltage VPPx. Each of the nonvolatile memory devices 1100 may be implemented using the three-dimensional memory device 100 described in FIG. 1.

The SSD controller 1200 is connected to the nonvolatile memory devices 1100 via a plurality of channels CH1 to CHi (i being an integer equal to or greater than 2). The SSD controller 1200 may be implemented using the memory controller 200 shown in FIG. 13. The SSD controller 1200 includes at least one processor 1210, a buffer memory 1220, an error correction code (ECC) circuit 1230, a host interface 1250, and a nonvolatile memory interface 1260.

The buffer memory 1220 may temporarily store data used to drive the memory controller 1200. The buffer memory 1220 may include a plurality of memory lines to store data or a command. The memory lines may be mapped to cache lines by various methods. The ECC circuit 1230 may calculate an ECC value of data to be programmed during a write operation, correct an error of data read during a read operation based on the ECC value, and correct an error of restored data from the nonvolatile memory device(s) 1100 during a data restore operation. The SSD controller 1200 may further include a code memory for storing code data used to drive the memory controller 1200. The code memory may be implemented using a nonvolatile memory device.

The host interface 1250 may provide an interface function with an external device. The host interface 1250 may be a NAND flash interface. The host interface 1250 may be implemented using various interfaces, other than the NAND flash interface. The nonvolatile memory interface 1260 may provide an interface function with the nonvolatile memory device 1100(s).

The SSD 1000 may operate to compensate wordline coupling depending on memory cell characteristics. Thus, performance of the SSD 1000 may be enhanced.

Figure 15:
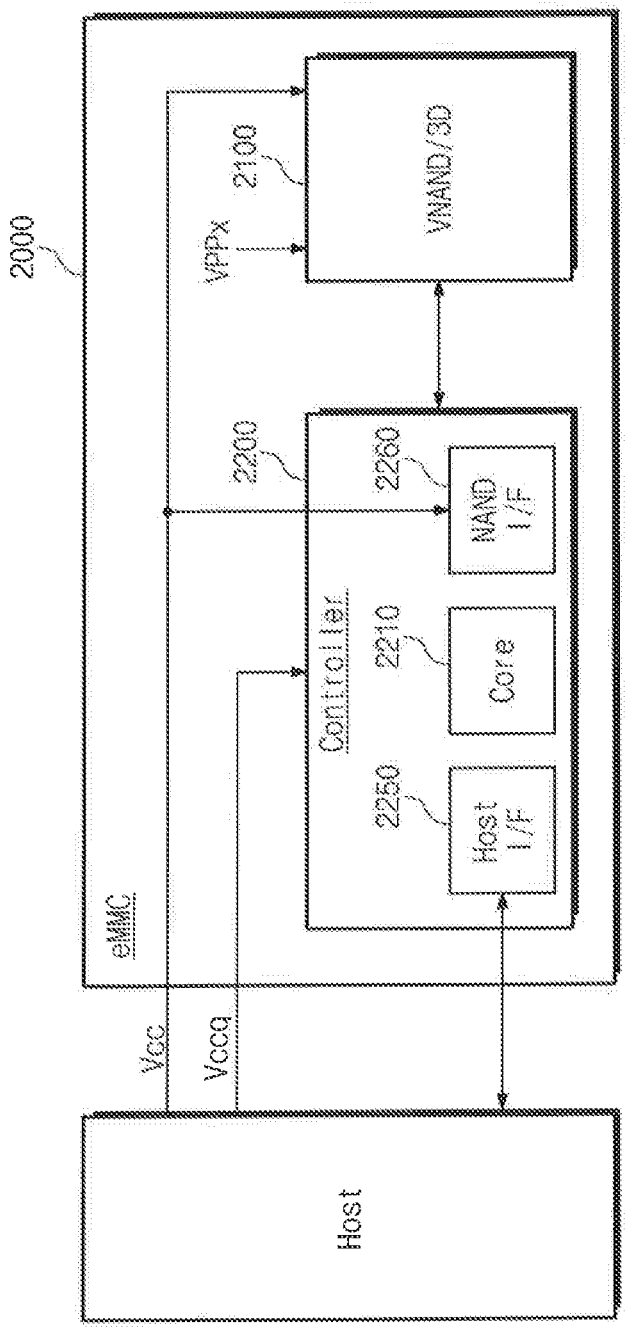
FIG. 15 illustrates an embedded multimedia card (eMMC) according to an exemplary embodiment of the inventive concept.

The inventive concept may be applied to an embedded multimedia card (eMMC), a moviNAND flash memory, and an iNAND flash memory. FIG. 15 is a block diagram of an eMMC 2000 according to an exemplary embodiment of the inventive concept. As illustrated, the eMMC 2000 may include at least one NAND flash memory device 2100 (e.g., VNAND/3D) and a memory controller 2200.

The NAND flash memory device 2100 may be implemented using the nonvolatile memory device 100 described with reference to FIG. 1. The memory controller 2200 is connected to the NAND flash memory device 2100 through a plurality of channels. The memory controller 2200 may be implemented using the memory controller 200 shown in FIG. 13.

The memory controller 2200 includes at least one control core 2210, a host interface 2250, and a NAND interface 2260. The at least one control core 2210 controls the overall operation of the eMMC 2000. The host interface 2250 performs host interfacing with a host. The NAND interface 2260 performs interfacing between the NAND flash memory device 2100 and the controller 2200. In an exemplary embodiment of the inventive concept, the host interface 2250 may be a parallel interface (e.g., an MMC interface). In an exemplary embodiment of the inventive concept, the host interface 2250 may be a serial interface (e.g., an ultra high speed (UHS)-II or a universal flash storage (UFS) interface). In an exemplary embodiment of the inventive concept, the host interface 2250 may be a NAND interface.

The eMMC 2000 receives power supply voltages Vcc and Vccq from the host. A first power supply voltage Vcc (e.g., 3.3 volts) is supplied to the NAND flash memory device 1100 and the NAND interface 2260, and a second power supply voltage Vccq (e.g., 1.8 volts/3.3 volts) is supplied to the controller 2200. In an exemplary embodiment of the inventive concept, the eMMC 2000 may receive an external high voltage VPPx.

The above-described eMMC 2000 may perform an optimal operation depending on memory cell characteristics to anticipate a high-speed operation and thus enhance reliability and reduce an error occurrence rate.

Figure 16:
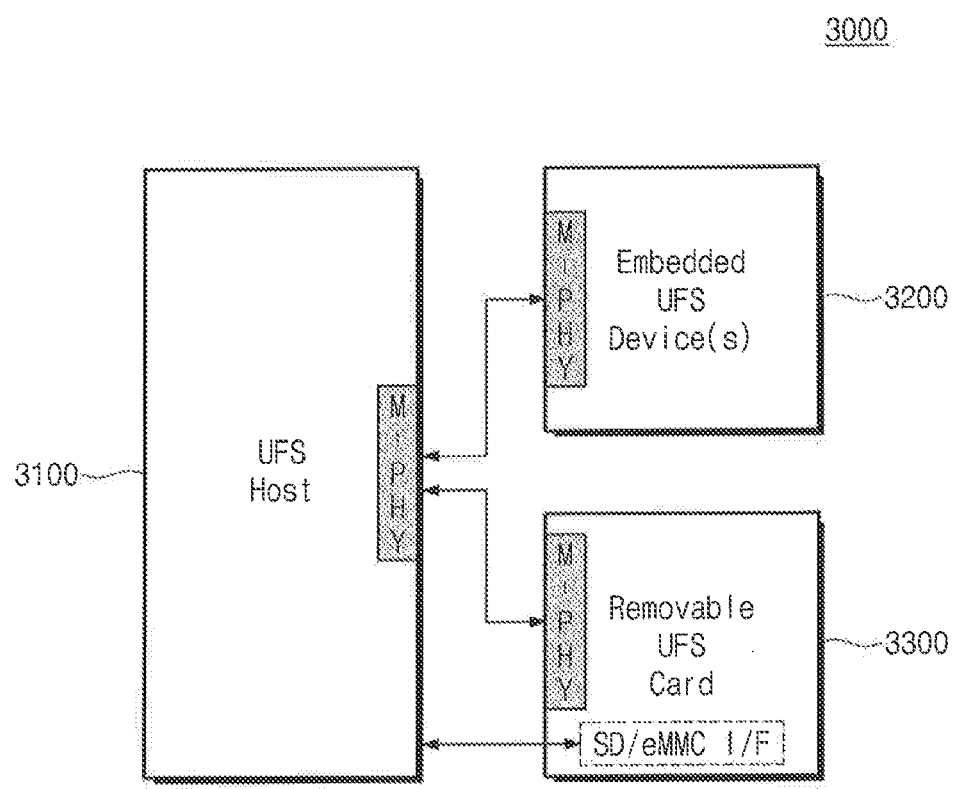
FIG. 16 illustrates a universal flash storage (UFS) system according to an exemplary embodiment of the inventive concept.

The inventive concept may be applied to a UFS. FIG. 16 is a block diagram of a UFS system 3000 according to an exemplary embodiment of the inventive concept. As illustrated, the UFS system 3000 may include a UFS host 3100, at least one embedded UFS device 3200, and a removable UFS card 3300. Communication between the UFS host 3100 and the embedded UFS device 3200 and communication between the UFS host 3100 and the removable UFS card 3300 may be performed through an M-PHY layer (e.g., MIPI® M-PHY).

At least one of the embedded UFS device 3200 and the removable UFS card 3300 may be implemented using the storage device 10 shown in FIG. 13.

The UFS host 3100 may include a bridge to communicate with the removable UFS card 3300 by means of another protocol apart from the UFS protocol. The UFS host 3100 and the removable UFS card 3400 may communicate with each other by means of various card protocols (e.g., universal flash devices (UFDs), MMC, secure digital (SD), mini SD, micro SD, etc.).

Figure 17:
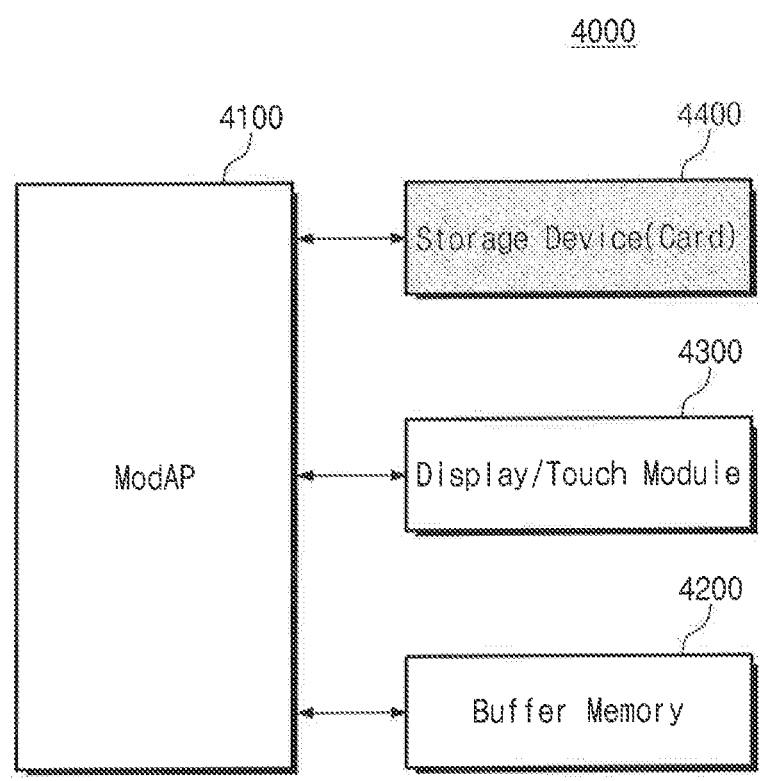
FIG. 17 illustrates a mobile device according to an exemplary embodiment of the inventive concept.

The inventive concept may be applied to a mobile device. FIG. 17 is a block diagram of a mobile device 4000 according to an exemplary embodiment of the inventive concept. As illustrated, the mobile device 4000 may include an integrated processor (ModAP) 4100, a buffer memory 4200, a display/touch module 4300, and a storage device 4400.

The integrated processor 4100 controls the overall operation of the mobile device 4000 and wired/wireless communication with an external entity. The buffer memory 4200 may be implemented to temporarily store data used during a processing operation of the mobile device 4000. The display/touch module 4300 may be implemented to display data processed by the integrated processor 4100 or receive data from a touch panel. The storage device 4400 may be implemented to store user data. The storage device 4400 may be an eMMC, an SSD or a UFS device. The storage device 4400 may perform a wordline coupling compensation operation, as described in FIGS. 1 to 13.

The mobile device 4000 may perform an adjacent wordline coupling compensation process to achieve optimal operation performance.

A memory system or a storage device according to an exemplary embodiment of the inventive concept may be packaged as one of various types to be subsequently embedded. For example, the memory system or the storage device may be packaged by Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-Level Processed Stack Package (WSP).

According to exemplary embodiments of the inventive concept described above, different unselected wordline voltages are applied according to relative positions of a layer of a wordline to improve characteristics of a memory cell.

While the present inventive concept has been particularly shown and described with reference to exemplary embodiments thereof, it will be understood by those of ordinary skill in the art that various changes and variations in form and details may be made therein without departing from the spirit and scope of the inventive concept as defined by the following claims.

What is claimed is:

1. An operating method of a nonvolatile memory device including a plurality of strings each string including at least two pillars penetrating wordlines disposed at different layers, the operating method comprising:
applying unselected wordline voltages to unselected wordlines; and
applying a selected wordline voltage to a selected wordline,
wherein the unselected wordline voltage applied to the same layer as a layer of the selected wordline is different from the unselected wordline voltage applied to a different layer than the layer of the selected wordline,
wherein during a program operation including a pass voltage applying period and a program voltage applying period, the different wordline voltages are applied at one of the pass voltage applying period and the program voltage applying period.

2. The operating method as set forth in claim 1, wherein each of the strings comprises:
a first pillar coupled between a common source line and a back-gate transistor; and
a second pillar coupled between a bitline and the back-gate transistor.

3. The operating method as set forth in claim 2, wherein when a memory cell of the first or second pillars is driven, the method comprises:
applying a first unselected wordline voltage to an unselected wordline connected to a pillar of the first and second pillars not including the memory cell and disposed at the same layer as the layer of the selected wordline; and
applying a second unselected wordline voltage to an unselected wordline connected to the pillar not including the memory cell and disposed above or below the layer of the selected wordline,
wherein the first unselected wordline voltage and the second unselected wordline voltage are different from each other.

4. The operating method as set forth in claim 2, wherein when a memory cell of the first or second pillars is driven, the method comprises:
applying a first unselected wordline voltage to an unselected wordline connected to a pillar of the first and second pillars not including the memory cell and disposed at the same layer as the layer of the selected wordline; and
applying second unselected wordline voltages to at least two unselected wordlines connected to the pillar not including the memory cell and disposed above or below the layer of the selected wordline,
wherein the first unselected wordline voltage and each of the second unselected wordline voltages are different from each other.

5. The operating method as set forth in claim 2, wherein when a memory cell of the first or second pillars is driven, the method comprises:
applying a first unselected wordline voltage to an unselected wordline connected to a pillar of the first and second pillars not including the memory cell and disposed at the same layer as the layer of the selected wordline;
applying a second unselected wordline voltage to an unselected wordline connected to the pillar not including the memory cell and disposed above or below the layer of the selected wordline; and
applying a third unselected wordline voltage to an unselected wordline connected to a pillar of the first and second pillars including the memory cell and disposed above or below the layer of the selected wordline,
wherein the first unselected wordline voltage, the second unselected wordline voltage, and the third unselected wordline voltage are different from one another.

6. The operating method as set forth in claim 1, wherein the different unselected wordline voltages are applied at the program voltage applying period for a predetermined time, and after the predetermined time, the unselected wordlines are applied with the same pass voltage.

7. The operating method as set forth in claim 1, wherein the different unselected wordline voltages are applied in response to externally received information.

8. An operating method of a nonvolatile memory device including a plurality of strings each string including at least two pillars penetrating wordlines disposed at different layers, the operating method comprising:
applying unselected wordline voltages to unselected wordlines; and
applying a selected wordline voltage to a selected wordline,
wherein the unselected wordline voltage applied to the same layer as a layer of the selected wordline is different from the unselected wordline voltage applied to a different layer than the layer of the selected wordline, wherein each of the strings comprises:
a first pillar coupled between a common source line and a back-gate transistor; and
a second pillar coupled between a bitline and the back-gate transistor,
wherein when a program operation is performed on a memory cell of the first or second pillars, the method comprises:
applying a first pass voltage to an unselected wordline connected to a pillar of the first and second pillars not including the memory cell and disposed at the same layer as the layer of the selected wordline;
applying a second pass voltage to an unselected wordline connected to the pillar not including the memory cell and disposed above or below the layer of the selected wordline;
applying a third pass voltage to an unselected wordline connected to a pillar of the first and second pillars including the memory cell and disposed above or below the layer of the selected wordline; and
applying a pass voltage to the other unselected wordlines of the first and second pillars,
wherein the first pass voltage, the second pass voltage, the third pass voltage, and the pass voltage are different from one another.

9. An operating method of a nonvolatile memory device including a plurality of strings each string including at least two pillars penetrating wordlines disposed at different layers, the operating method comprising:
applying unselected wordline voltages to unselected wordlines; and
applying a selected wordline voltage to a selected wordline,
wherein the unselected wordline voltage applied to the same layer as a layer of the selected wordline is different from the unselected wordline voltage applied to a different layer than the layer of the selected wordline, wherein each of the strings comprises:
a first pillar coupled between a common source line and a back-gate transistor; and
a second pillar coupled between a bitline and the back-gate transistor, wherein when a read operation is performed on a memory cell of the first or second pillars, the method comprises:
applying a first read pass voltage to an unselected wordline connected to a pillar of the first and second pillars not including the memory cell and disposed at the same layer as the layer of the selected wordline;
applying a second read pass voltage to an unselected wordline connected to the pillar not including the memory cell and disposed above or below the layer of the selected wordline;
applying a third read pass voltage to an unselected wordline connected to a pillar of the first and second pillars including the memory cell and disposed above or below the layer of the selected wordline; and
applying a read pass voltage to the other unselected wordlines of the first and second pillars,
wherein the first read pass voltage, the second read pass voltage, the third read pass voltage, and the read pass voltage are different from one another.

10. A storage device, comprising:
at least one nonvolatile memory device including a plurality of strings each string including a first pillar and a second pillar penetrating wordlines disposed at different layers, the first pillar being coupled between a bitline and a back-gate transistor and the second pillar being coupled between a common source line and the back-gate transistor; and
a memory controller configured to control the at least one nonvolatile memory device,
wherein the at least one nonvolatile memory device applies different unselected wordline voltages to unselected wordlines depending on a layer on which they are located in relation to a layer of a selected wordline to compensate wordline coupling.

11. The storage device as set forth in claim 10, further comprising:
a coupling compensation unit configured to control the at least one nonvolatile memory device to compensate the wordline coupling.

12. The storage device as set forth in claim 10, wherein during a program operation of the at least one nonvolatile memory device, at a pass voltage applying period,
a first pass voltage is applied to an unselected wordline disposed at the same layer as the layer of the selected wordline, a second pass voltage is applied to an unselected wordline disposed at a layer different from the layer of the selected wordline, and a pass voltage is applied to the selected wordline, and
at a program voltage applying period, a program voltage is applied to the selected wordline and the pass voltage is applied to the unselected wordlines, and
wherein the first pass voltage, the second pass voltage, and the pass voltage are different from one another.

13. The storage device as set forth in claim 10, wherein during a program operation of the at least one nonvolatile memory device,
at a pass voltage applying period, a pass voltage is applied to the selected wordline and the unselected wordlines, and at a program voltage applying period, a first pass voltage is applied to an unselected wordline disposed at the same layer as the layer of the selected wordline for a predetermined time, a second pass voltage is applied to an unselected wordline disposed at a layer different from the layer of the selected wordline for the predetermined time, and a program voltage is applied to the selected wordline, and wherein the first pass voltage, the second pass voltage, and the pass voltage are different from one another.

14. A nonvolatile memory device, comprising:
a plurality of strings each string including a first pillar coupled between a common source line and a back-gate transistor and a second pillar coupled between a bitline and the back-gate transistor,
wherein when a memory cell of the first or second pillars is driven,
a first unselected wordline voltage is applied to a first unselected wordline disposed at the same layer as a layer of the memory cell and connected to the pillar that does not include the memory cell, and
a second unselected wordline voltage is applied to a second unselected wordline disposed at a layer different from the layer of the memory cell and connected to the pillar that does not include the memory cell, and
wherein the first unselected wordline voltage and the second unselected wordline voltage are different from each other.

15. The nonvolatile memory device as set forth in claim 14, wherein a third unselected wordline voltage is applied to an unselected wordline disposed at a layer different from the layer of the memory cell and connected to the first pillar or the second pillar, and
wherein the first unselected wordline voltage, the second unselected wordline voltage, and the third unselected wordline voltage are different from one another.

16. The nonvolatile memory device as set forth in claim 15, wherein an unselected wordline voltage different from the first unselected wordline voltage, the second unselected wordline voltage, and the third unselected wordline voltage is applied to the other unselected wordlines of the first and second pillars.

17. The nonvolatile memory device as set forth in claim 14, wherein the first unselected wordline voltage is lower than the second unselected wordline voltage during a program operation.

18. The nonvolatile memory device as set forth in claim 17, wherein an selected wordline voltage higher than the first and second selected wordline voltages is applied to the other unselected wordlines of the first and second pillars during the program operation.

19. A method of operating a nonvolatile memory device including a plurality of stacked wordlines, the method comprising:
applying a first voltage to a selected wordline; and
while the first voltage is applied to the selected wordline, the method further comprises:
applying a second voltage to a first unselected wordline disposed at the same layer as a layer of the selected wordline; and
applying a third voltage to a second unselected wordline disposed at a different layer than the layer of the selected wordline,
wherein the first and second unselected wordlines are adjacent to each other and the first, second and third voltages are different from each other.

20. The method of claim 19, wherein the selected wordline is connected to a memory cell disposed along a first pillar and the first unselected wordline is connected to a memory cell disposed along a second pillar.

21. The method of claim 20, wherein the second unselected wordline is connected to a memory cell disposed along the second pillar.

* * * * *